United States Patent [19]
Rail

[11] Patent Number: 5,710,919
[45] Date of Patent: Jan. 20, 1998

[54] RECORD COMPRESSION

[75] Inventor: Peter D. Rail, Plano, Tex.

[73] Assignee: Electronic Data Systems Corporation, Plano, Tex.

[21] Appl. No.: 536,872

[22] Filed: Sep. 29, 1995

[51] Int. Cl.$^6$ .................................................. G06F 17/30
[52] U.S. Cl. ...................... 395/612; 364/715.02; 341/52
[58] Field of Search .................................. 395/612, 611; 364/715.02; 341/50, 52

[56] References Cited

U.S. PATENT DOCUMENTS

| | | | |
|---|---|---|---|
| 4,446,516 | 5/1984 | Nishimura | 711/100 |
| 5,179,711 | 1/1993 | Vreeland | 341/59 |
| 5,603,022 | 2/1997 | Ng et al. | 395/612 |

OTHER PUBLICATIONS

Witten et al., "Indexing and Compressing Full-Text Databases for CD-ROM", Journal or Information Science, vol. 17, No. 5, pp. 265–271, May 1991.

Alsberg, "Space and Time Savings Through Large Data Base Compression and Dynamic Restructuring" Proceedings of the IEEE, vol. 63, No. 8, pp. 1114–1122, Aug. 1975.

*Primary Examiner*—Thomas G. Black
*Assistant Examiner*—Jack M. Choules
*Attorney, Agent, or Firm*—L. Joy Griebenow

[57] ABSTRACT

A system (10) for compressing and decompressing records includes a decompressed file (12) and a compressed file (14). A first record is stored in a first buffer (18) and a second record is stored in a second buffer (20). A vertical compression technique compares the first record and the second record, on a field-by-field basis, and replaces the field of the second record with a vertical repeat indicator if the field of the second record matches the corresponding field of the first record. A horizontal compression technique further compresses the second record by replacing adjacent matching characters with a horizontal repeat indicator.

15 Claims, 4 Drawing Sheets

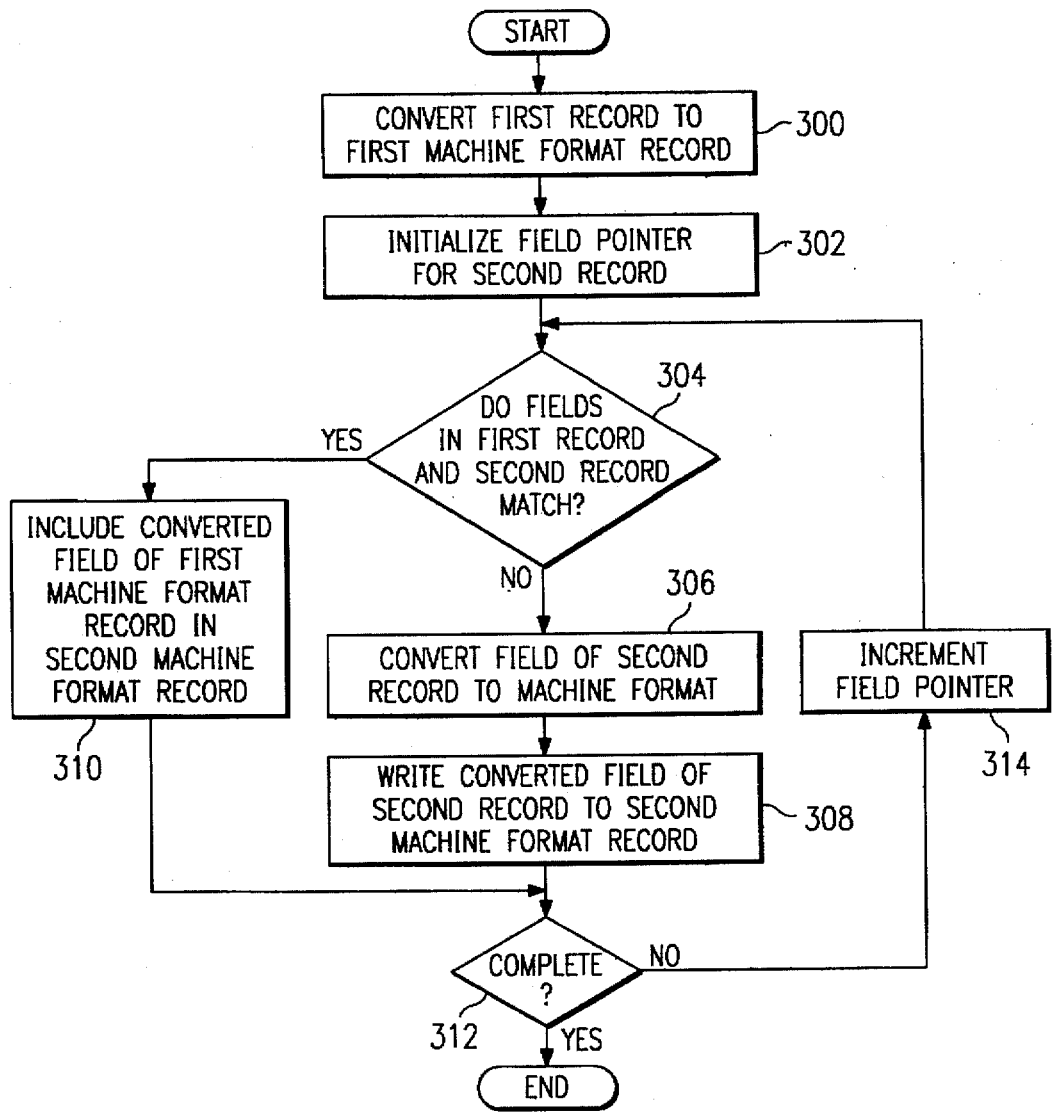

5,710,919

RECORD COMPRESSION

BACKGROUND OF THE INVENTION

Computers manipulate or process information. The information used by computers is often stored in files of various formats and sizes. In a records-based computer system, a file may contain a number of separate records which each provide information for a single transaction to be processed by the computer. Each record in a file may contain a number of fields.

There are several techniques to maintain the structure of records and fields in a file. One such technique separates variable length fields in a record by a delimit indicator. In a character-based record this delimit indicator may be a space, a comma, a tab, or any other suitable character recognized by the computer to separate fields.

A computer system may process millions of these records in a single day. Often the information stored in fields is repeated between records. Compression of these records can drastically reduce file storage requirements and increase the processing efficiency of the computer system.

SUMMARY OF THE INVENTION

In accordance with the present invention, the disadvantages and problems associated with record compression have been substantially reduced or eliminated.

In accordance with one embodiment of the present invention, a method performed on a computer for compressing records having delimited fields compares, on a field-by-field basis, a first record to a second record and replaces each field of the second record with a vertical repeat indicator if the field of the second record matches the corresponding field of the first record.

Important technical advantages of the present invention include a vertical compression technique that replaces each field in a record with a vertical repeat indicator when the field matches a corresponding field in a previous record. In one embodiment, this vertical repeat indicator is a single character, such as the ditto sign. Another advantage of the present invention includes a horizontal compression technique that replaces adjacent matching characters in a record, including adjacent vertical repeat indicators, with a horizontal repeat indicator. These vertical and horizontal compression techniques may be improved by sorting the records of the file before compression. If the records include numerical data, the present invention provides a further technical advantage by reducing the number of conversions of numerical data to machine format.

BRIEF DESCRIPTION OF THE DRAWINGS

For a more complete understanding of the present invention and for further features and advantages, reference is now made to the following description taken in conjunction with the accompanying drawings, in which:

FIG. 5 illustrates a flow chart of a method for converting fields of a record to a machine format.

DETAILED DESCRIPTION OF THE INVENTION

Figure 1:
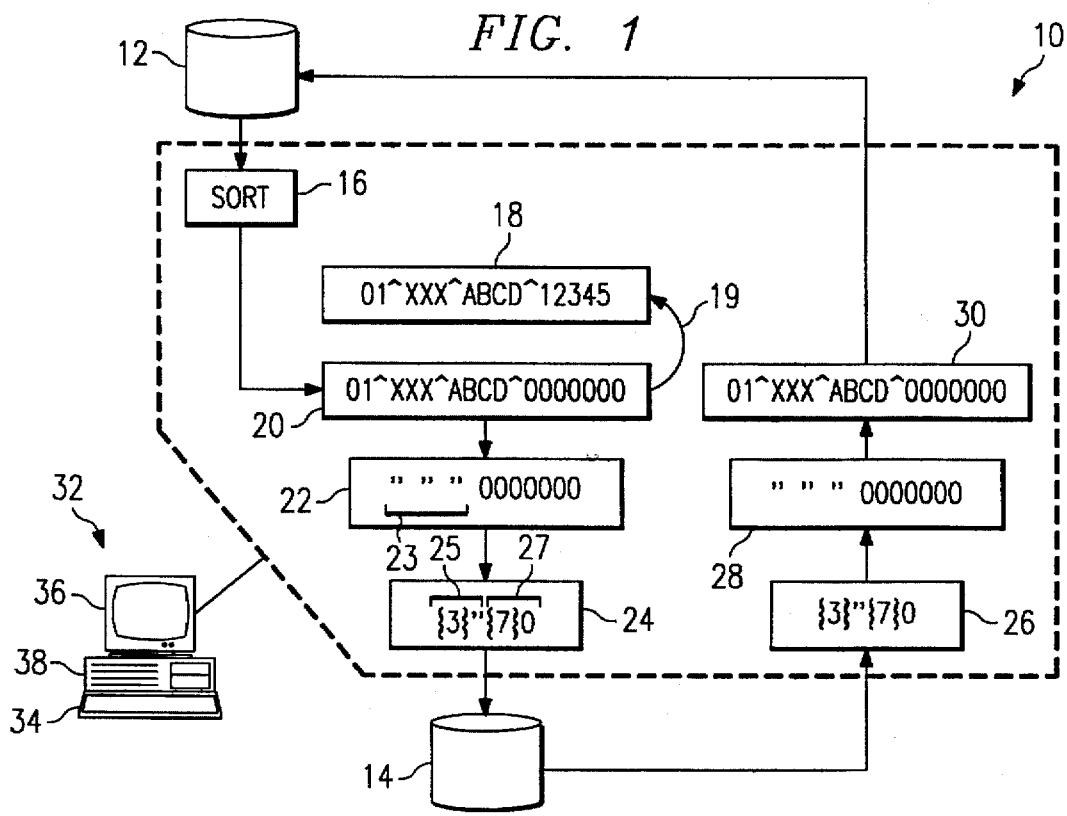
FIG. 1 illustrates a system for compressing and decompressing records.

FIG. 1 illustrates a system 10 for processing records stored in decompressed file 12 and compressed file 14. Records processed by system 10 may represent any information arranged in delimited format. In one embodiment, information processed by system 10 may include call detail records that are processed for billing telecommunications services.

Decompressed file 12 stores a plurality of delimited records in memory, such as on magnetic media, CD-ROM, optical, or other volatile or non-volatile storage media. In a UNIX-based computer system, decompressed file 12 may contain one or more UNIX files of up to two gigabytes in size. Similarly, compressed file 14 stores one or more files of delimited records after compression.

Compressed file 12 is coupled to sort module 16, which initially sorts delimited records by one or more fields to improve compression effectiveness. For example, if system 10 processes call detail records, sort module 16 may sort records by a connect date field, a calling number field, a called number field, or other field that places similar records adjacent to each other in the file to be compressed.

Sort module 16 is coupled in sequence to second buffer 20 and first buffer 18, as indicated by arrow 19. The compressed version of the record in buffer 20 appears in buffer 22 after vertical compression and in buffer 24 after horizontal compression. The vertically and horizontally compressed record is stored in compressed file 14. Buffers 26, 28, and 30 couple in sequence to allow decompression of records stored in compressed file 14. It should be understood that buffers 18, 20, 22, 24, 26, 28, and 30 are illustrated to describe the compression and decompression techniques and that one skilled in the art may utilize any suitable collection and arrangement of buffers, registers, or other memory locations or devices to practice the teachings of the present invention.

System 10 may operate on one or more computers, shown generally as computer 32. Computer 32 maintains and executes the instructions to implement sort module 16 and manipulate records in the buffers to perform both vertical and horizontal compression and decompression. Computer 32 includes an input device 34, such as a keypad, touch screen, or other device that can accept information. Output device 36 conveys information associated with the operation of system 10, including digital data, visual information, or audio information. Both input device 34 and output device 36 may include fixed or removable storage media, such as magnetic computer disk, CD-ROM, or other suitable media to both receive output from and provide input to system 10. Processor 38 and its associated memory execute instructions and manipulate information in accordance with the operation of system 10 described below.

In operation, records from decompressed file 12 are sorted by sort module 16 and transferred in sequence through second buffer 20 and first buffer 18. A first record is initially stored in second buffer 20 and then transferred to first buffer 18, as indicated by arrow 19. At this point, the compression of the second record stored in second buffer 20 proceeds in two steps: vertical compression and horizontal compression.

Vertical compression compares, on a field-by-field basis, the first record to the second record. If the corresponding fields in the two records match, then a vertical repeat indicator is written to buffer 22. If corresponding fields of the two records do not match, then the field from the second record is written to buffer 22. In the example shown in FIG. 1, the first three fields of both records (01^XXX^ABCD)

match. Therefore, the first three fields of the second record are represented in buffer 22 by three successive vertical repeat indicators 23, shown here as three ditto signs. The last field of the first record and the second record do not match, so the last field from the second record (0000000) is written to buffer 22.

Horizontal compression further compresses the second record by replacing adjacent matching characters stored in buffer 22 with horizontal repeat indicators stored in buffer 24. This may be accomplished by a run-length encoding (RLE) method or any other suitable method that can effectively compress repeated information in a single record. Horizontal compression not only removes repeated characters within fields, but also removes horizontal runs of vertical repeat indicators. As shown in buffer 24, a first horizontal repeat indicator 25 represents the run of three vertical repeat indicators 23 and a second horizontal repeat indicator 27 represents the run of seven zeros in the last field of the second record.

In one embodiment, the horizontal repeat indicator comprises a character and a number indicating the repetitions of the character in the record. A horizontal repeat indicator may be a two-byte representation. The first byte comprises a repeat indicator bit, a bit indicating whether the repeat character is a vertical repeat indicator, and the remaining bits representing the number of repetitions. The second byte designates the repeated character. If the repeat character is a vertical repeat indicator, then the second byte is not needed.

The vertically and horizontally compressed second record stored in buffer 24 is then transferred to compressed file 14. Decompressed second record in second buffer 20 is transferred to first buffer 18, as indicated by arrow 19, and the next record is loaded in buffer 20 for compression. The process continues until all records from decompressed file 12 are compressed and stored in compressed file 14.

The compressed form of records stored in compressed file 14 provides several advantages. File storage space is drastically reduced, which may be critical if system 10 imposes a file size restriction, such as the two gigabyte limit imposed by typical UNIX operating environments. For files with similar adjacent records, such as call detail records, the effective compression ratio from decompressed file 12 to compressed file 14 may be five-to-one or higher. In addition, compressed file 14 may provide certain advantages in processing records. Some compression techniques may not preserve the record separator in the file after compression. However, vertical and horizontal compression preserves the record separator in the file, which allows a record counting utility to determine the number of records in compressed file 14.

To decompress records in compressed file 14, vertical and horizontal compression described above is performed in reverse order. The horizontal repeat indicators stored in buffer 26 are first expanded and stored in buffer 28. As each record stored in compressed file 14 is processed serially, buffer 30 contains the decompressed fields of the previous record. Fields in buffer 28 represented by vertical repeat indicator match corresponding fields in buffer 30, and these portions of buffer 30 need not be modified. Fields in buffer 28 not represented by vertical repeat indicators are written to buffer 30 to reproduce the decompressed record. The decompressed record stored in buffer 30 is stored in decompressed file 12, and the next record in sequence is processed.

Figure 2:
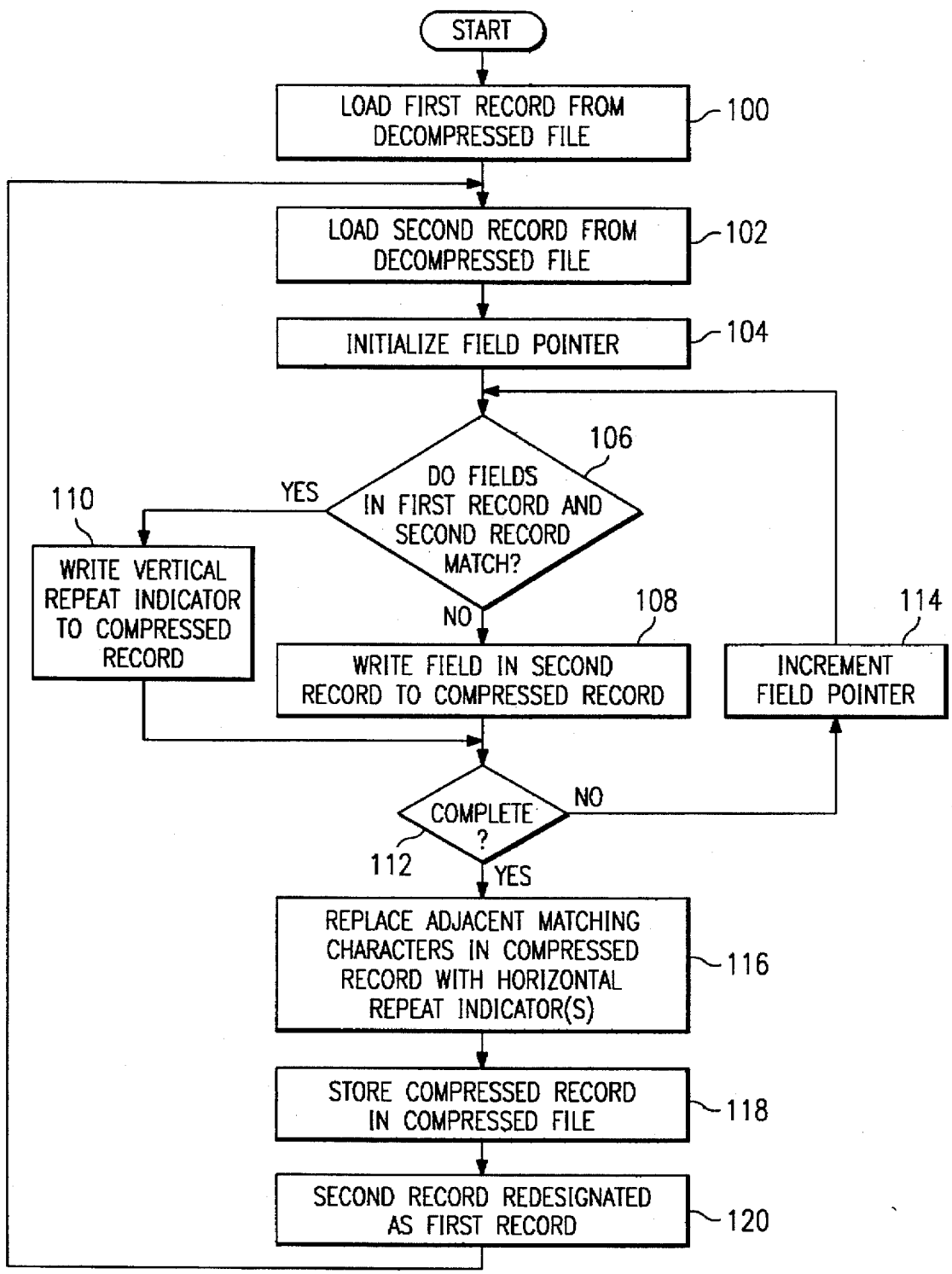
FIG. 2 illustrates a flow chart of a method for compressing records.

FIG. 2 illustrates a flow chart of a method for compressing a record. The method begins at step 100 where a first record from decompressed file 12 is loaded in first buffer 18. A second record from decompressed file 12 is loaded in second buffer 20 at step 102. A field pointer is then initialized before vertical compression at step 104.

For each field in the second record, vertical compression compares the field in the second record to the corresponding field in the first record at step 106. If the fields in the first record and the second record do not match, then the field from the second record is written to the compressed record stored in buffer 22 at step 108. If the fields in the first record and the second record match, then a vertical repeat indicator is written to the compressed record stored in buffer 22 at step 110. If the vertical compression process is not complete at step 112, then the field pointer is incremented at step 114 and the next field of the second record is processed at step 106.

After vertical compression is complete at step 112, adjacent matching characters in the compressed record stored in buffer 22 are replaced with a horizontal repeat indicator at step 116. The compressed record stored in buffer 24, after both vertical and horizontal compression, is then stored in compressed file 14 at step 118. As serial processing of records in decompressed file 12 continues, the second record is transferred to first buffer 18, as indicated by arrow 19, and redesignated as the first record at step 120. The process continues by loading a new second record in second buffer 20 at step 102. By maintaining a decompressed copy of the previously processed record in first buffer 18, the method of FIG. 2 serially compresses records from decompressed file 12 with reduced storage and processing requirements.

Figure 3:
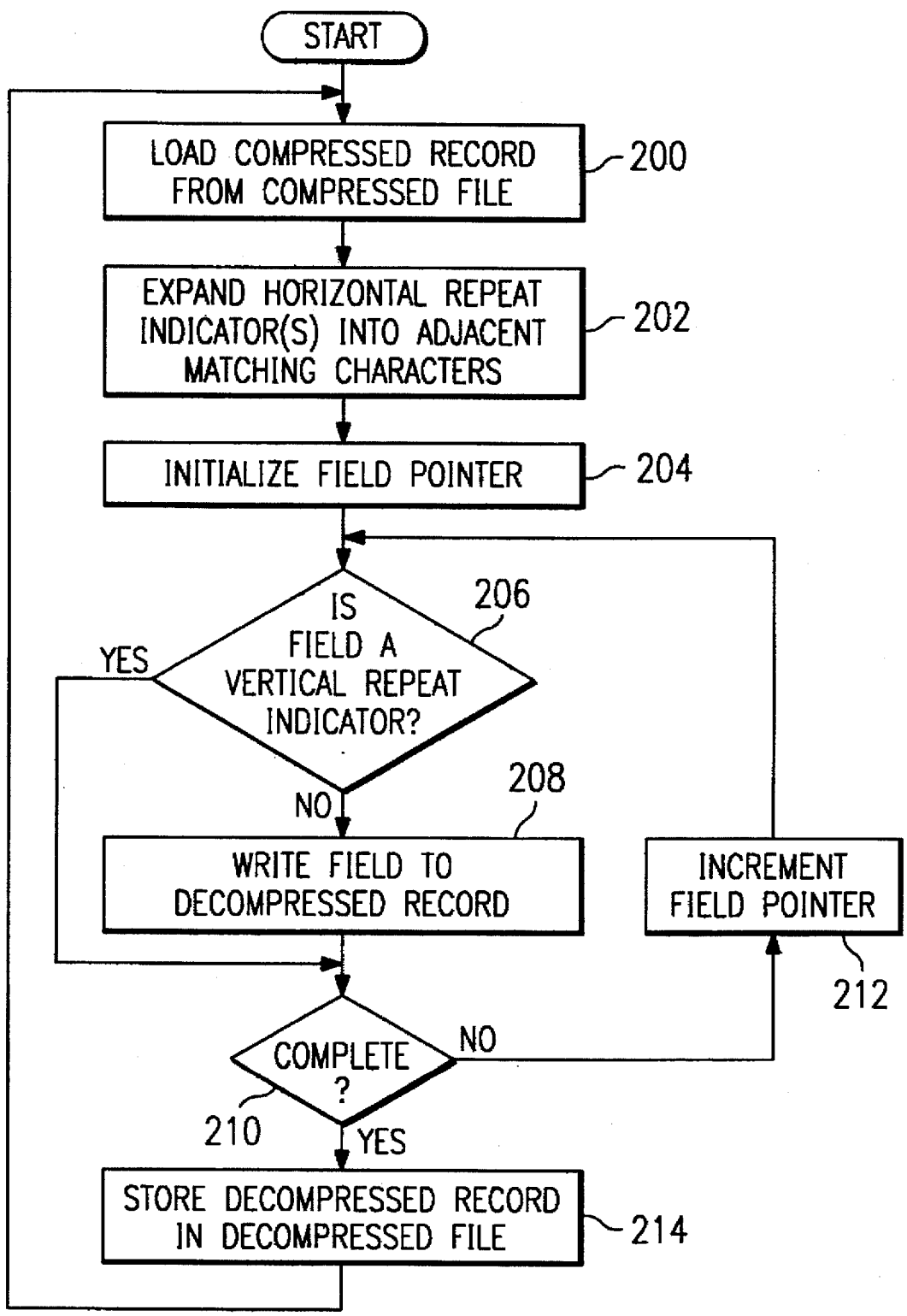
FIG. 3 illustrates a flow chart of a method for decompressing records.

FIG. 3 illustrates a flow chart of a method to decompress records stored in compressed file 14. The method begins at step 200 where a compressed record from compressed file 14 is loaded in buffer 26. The horizontal repeat indicators in the compressed record are expanded into adjacent matching characters at step 202 and stored in buffer 28. A field pointer is initialized before vertical decompression at step 204.

If the field in buffer 28 is not a vertical repeat indicator, then the field is written to the decompressed record stored in buffer 30 at step 208. If the field in buffer 28 is a vertical repeat indicator, then writing step 208 is bypassed and the corresponding field stored in buffer 30 from the previously decompressed record remains unchanged. Therefore, since buffer 30 initially contains the previously decompressed record, only those portions of compressed record stored in buffer 28 that vary from the previous record need to be modified in buffer 30. This operation streamlines decompression processing by reducing the number of writes to buffer 30 and by eliminating another buffer to store the previous decompressed record.

If vertical decompression is not complete at step 210, then field pointer is incremented at step 212 and the next field processed at step 206. If vertical decompression is complete, then the decompressed record in buffer 30 is stored in decompressed file 12 at step 214. The serial decompression process continues by loading the next compressed record from compressed file 14 into buffer 26 at step 200.

Figure 4:
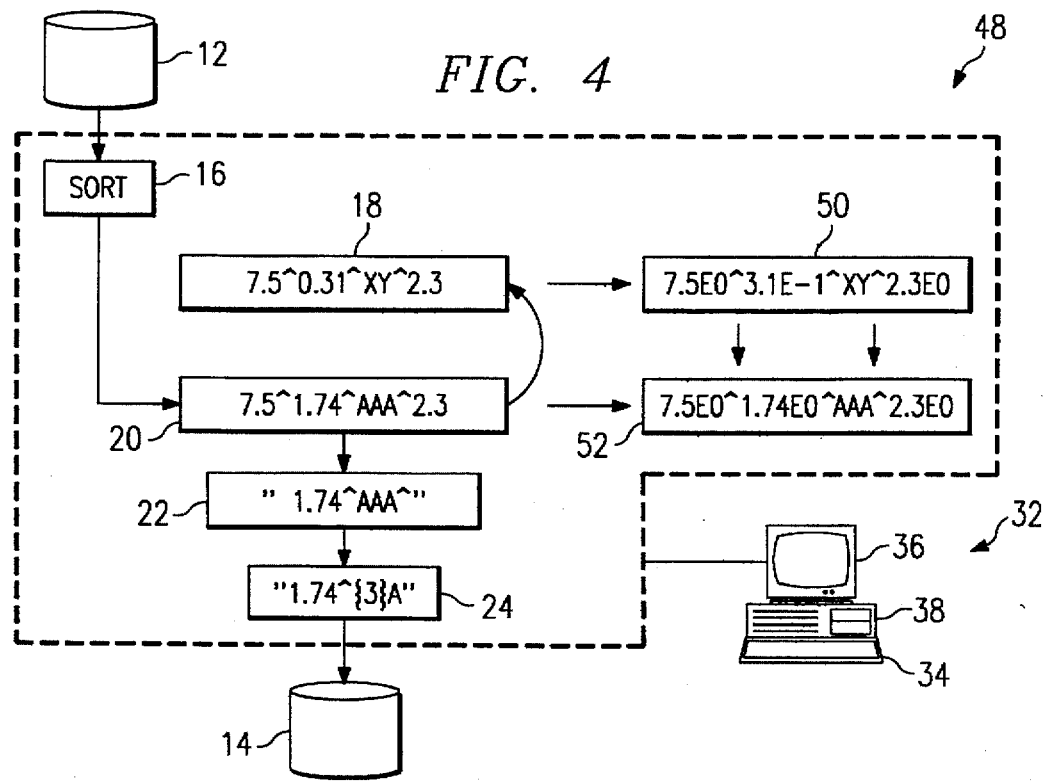
FIG. 4 illustrates a system for converting fields of a record to a machine format.

FIG. 4 illustrates a system 48 that includes the compression functionality of system 10 described above with reference to FIG. 1, but also includes a conversion capability. System 48 allows records to be converted from printable format to machine format. Printable format includes any suitable presentation of alphanumeric characters that may be read by a human operator or output to a printer or other output device. A machine format, such as single precision or double precision for numbers, includes any suitable representation of an alphanumeric character that may be processed or manipulated by computer 32. Often conversion from printable format to machine format utilizes valuable processing time, which may become significant for systems that process millions of records.

System 48 includes two buffers 50 and 52 to perform the conversion feature. Buffer 50 stores a first machine format record that corresponds to the first record stored in first buffer 18. Buffer 52 stores the second machine format record corresponding to a second record stored in second buffer 20. It should be understood that buffers 50 and 52 are illustrated to describe the conversion technique and that one skilled in the art may utilize any suitable collection and arrangement of buffers, registers, or other memory locations or devices to practice the teachings of the present invention.

In operation, system 48 converts records from printable format to machine format by utilizing the vertical repeat indicator described above. The process for compressing records stored in decompressed file 12 to compressed records stored in compressed file 14 is the same as that described above with reference to FIGS. 1 and 2. First buffer 18 stores a first record in printable format which is converted to a first machine format record stored in buffer 50. In one embodiment, the conversion transforms each numeric field in the first record to a machine format, such as double precision. For example, the number represented as "0.31" stored in printable format in first buffer 18 may be converted to the number represented as "3.1E-1" stored in machine format in buffer 50.

To take advantage of repeating fields between the first record and the second record, second machine format record stored in second buffer 52 may be generated using a combination of conversions from second buffer 20 and copies of already converted records from first machine format record 50. As shown in FIG. 4, the first and last fields of second machine format record stored in buffer 52 do not need to be converted again, but may be copied directly from buffer 50 to save processing and storage resources. This copying step may be performed, in part, by recognizing vertical repeat indicators stored in buffer 22. In one embodiment, buffers 50 and 52 may be replaced by a single buffer that stores the machine format of the current record.

FIG. 5 illustrates a flow chart of a method for converting a printable record to a machine format record in system 48. The method begins at step 300 where a first record is converted to a first machine format record. A field pointer is initialized before converting the second record to a machine format at step 302. If the fields in the first record and the second record do not match at step 304, then the field from the second record is converted to a machine format at step 306 and written to a second machine format record at step 308. However, if fields in the first record and the second record match at step 304, then the already converted field of the first machine format record is included in the second machine format record at step 310. This may be accomplished by writing the converted field of the first machine format record to a second machine format record or by retaining the converted field of the first machine format record in a buffer that now contains the second machine format record. If the conversion of fields in not complete at step 312, then the field pointer is incremented at step 314 and the next field processed at step 304.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the spirit and scope of the appended claims.

What is claimed is:

1. A method performed on a computer for compressing a plurality of records, each record comprising a plurality of delimited fields, each field comprising at least one character, the method comprising:

comparing, on a field-by-field basis, a first record to a second record;

replacing each field of the second record with a vertical repeat indicator if the field of the second record matches the corresponding field of the first record; and replacing adjacent matching characters in the second record with a horizontal repeat indicator.

2. The method of claim 1, wherein the vertical repeat indicator is a ditto sign.

3. The method of claim 2, wherein the horizontal repeat indicator comprises a character and a number indicating the repetitions of the character in the second record.

4. The method of claim 2, wherein the horizontal repeat indicator comprises the vertical repeat indicator and a number indicating the repetitions of the vertical repeat indicator in the second record.

5. The method of claim 2, wherein the records are sorted before the step of comparing.

6. The method of claim 2, comprising the following steps:
   converting the first record to produce a first machine format record; and generating a second machine format record by utilizing fields of the first machine format record that correspond to vertical repeat indicators in the second record.

7. The method of claim 2, comprising the following steps:
   storing a decompressed second record before the steps of replacing;

comparing, on a field-by-field basis, a third record to the decompressed second record;

replacing each field of the third record with a vertical repeat indicator if the field of the third record matches the corresponding field of the decompressed second record; and replacing adjacent matching characters in the third record with a horizontal repeat indicator.

8. A data processing system for compressing a plurality of records, each record comprising a plurality of delimited fields, each field comprising at least one character, the data processing system comprising:

a first buffer operable to store a first record;

a second buffer operable to store a second record; and a processor coupled to the first buffer and the second buffer, the processor operable to compare, on a field-by-field basis, the first record to the second record, the processor operable to replace each field of the second record with a vertical repeat indicator if the field of the second record matches the corresponding field of the first record, the processor further operable to replace adjacent matching characters in the second record with a horizontal repeat indicator.

9. The data processing system of claim 8, wherein the vertical repeat indicator is a ditto sign.

10. The data processing system of claim 8, wherein the processor sorts the delimited records before comparing.

11. The data processing system of claim 8, wherein the first buffer and the second buffer store printable characters.

12. The data processing system of claim 8, comprising:
    a third buffer operable to store the resulting conversion of the first record to a first machine format record; and a fourth buffer operable to store a second machine format record comprising fields of the first machine format record that correspond to vertical repeat indicators in the second record.

13. The data processing system of claim 8, wherein the processor replaces adjacent matching characters in the second record with a horizontal repeat indicator.

14. The data processing system of claim 13, wherein the horizontal repeat indicator comprises a character and a number indicating the repetitions of the character in the second record.

15. The data processing system of claim 13, wherein the horizontal repeat indicator comprises the vertical repeat indicator and a number indicating the repetitions of the vertical repeat indicator in the second record.

* * * * *